United States Patent [19]

Weaver

[11] Patent Number: 4,841,299

[45] Date of Patent: Jun. 20, 1989

[54] METHOD AND APPARATUS FOR DIGITAL ENCODING AND DECODING

[75] Inventor: Charles S. Weaver, Palo Alto, Calif.

[73] Assignee: Digital Recording Research Limited Partnership, Menlo Park, Calif.

[21] Appl. No.: 91,544

[22] Filed: Aug. 31, 1987

[51] Int. Cl.⁴ ............................................. H03M 7/40
[52] U.S. Cl. .................................. 341/65; 341/59; 341/63; 341/67; 358/260
[58] Field of Search ............... 341/59, 65, 67, 106, 341/63; 358/260

[56] References Cited

U.S. PATENT DOCUMENTS 3,560,639 2/1971 Centanni .............................. 178/6
4,396,906 8/1983 Weaver ............................... 340/347

OTHER PUBLICATIONS

W. R. McCray, Translating a Variable-Length Code-/IBM Technical Disclosure Bulletin, Apr. 1975, vol. 17, No. 11, pp. 3328–3329.
Eugene R. Hnatek, A User's Handbook of D/A and A/D Converters, 1976, pp. 361–363.
Ripley et al., "Pro. Comput. Cariol.", 1976, pp. 439–445.
Ruttimann et al., "IEEE Transactions on Biomedical Engineering", vol. BME-26, No. 11, Nov. 1979, pp. 613–623.
Atrubin, "IBM Technical Disclosure Bulletin", vol. 14, No. 3, Aug. 1971, pp. 874–876.
Miessler, "IBM Technical Disclosure Bulletin", vol. 17, No. 5, Oct. 1974, pp. 1489–1491.

Primary Examiner—William M. Shoop, Jr.
Assistant Examiner—Helen Kim
Attorney, Agent, or Firm—Victor R. Beckman

[57] ABSTRACT

Encoding and decoding method and apparatus are disclosed including a decoder for decoding a stream of encoded digital data words which have been encoded by an encoder using variable length code words in which the code words comprise a single group of 0 bits followed by a single group of 1 bits. The 0 bits and 1 bits are separately counted (46), and the combined counts are used to address a read only memory (54) containing the decoded digital data words. The decoded digital data word is read out from the addressed memory location. Also disclosed is an AND gate array 70 of rows and columns of AND gates (90-1 etc.), in which the number of 0s in the code word determines which row is energized, and the number of 1s in the code word determines which column is energized. The energized AND gate is indicative of the decoded digital data word.

21 Claims, 3 Drawing Sheets

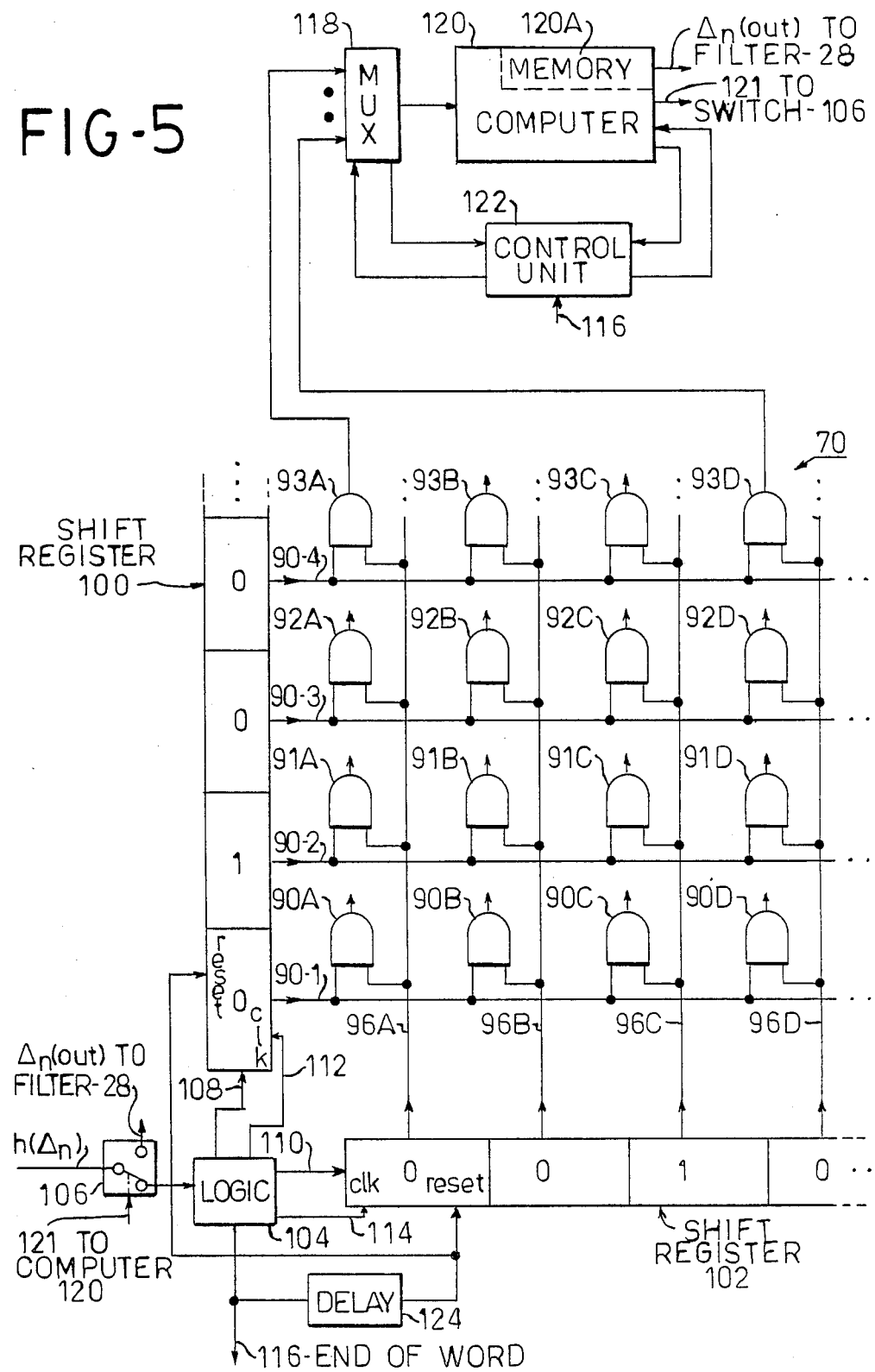

METHOD AND APPARATUS FOR DIGITAL ENCODING AND DECODING

TECHNICAL FIELD

This invention relates to digital data compression systems, and more particularly to apparatus and method for encoding compressed sample signals and for decoding encoded signals for use therein, and a novel truncated variable word length code implemented thereby.

BACKGROUND OF THE INVENTION

Systems which include means for converting analog signals to digital form, then compression filtering and encoding the compressed signals for recording or for transmission to a remote location, together with playback or receiver means which include a decoder, a digital reconstruction filter, and means for converting the decoded and filtered digital signals back to analog form are well known as shown in U.S. Pat. No. 4,449,536, issued May 22, 1984, by the present inventor. Similar systems are shown in the following articles: Ruttimann et al, "IEEE Transactions on Biomedical Engineering," vol. BME-26, No. 11, Nov. 1979, pp. 613–623 and Ripley et al, "Pro. Comput. Cardiol." 1976, pp. 439–445.

Truncated Huffman encoding is used in the above-mentioned systems, and another truncated Huffman code is shown in U.S. Pat. No. 4,396,906, issued Aug. 2, 1983, by the present inventor. The code disclosed in U.S. Pat. No. 4,396,906 includes a single 1's bit in the code word at the least significant bit position. Other bit positions of the code words contain only 0's. Infrequently occurring compressed signals are labelled, and the labelled compressed signals are provided at the output from the coder.

A Huffman code has the property that two or more code words cannot be placed in sequence to generate another member of the code word set. This property makes it possible to find the beginning and end of each code word without the need for an end-of-word symbol. A buffer memory is included in the playback or receiver means upstream of the decoder which allows for operation of the decoder at a substantially constant word rate even though the code words supplied thereto are of variable word length. However, when bit errors occur, and the decoder is not synchronized, bits will be taken from the buffer memory at an instantaneous rate that is greater than the rate those same bits were produced during the encoding process. A plurality of valid code words are required for each resynchronization. If there are many bit errors, such as may occur during transmission between transmitting and receiving units, there is a high probability of underflow of the receiver buffer memory means.

SUMMARY OF THE INVENTION AND OBJECTS

A principal object of the present invention is the provision of a simplified truncated variable word length coding and decoding means which implements a novel code such that the decoder can be resynchronized at the next true code word, whereby underflow of the receiver buffer due to desynchronization is eliminated.

The novel truncated code implemented by the present invention comprises a group of zero bits at one end of the code word, say at the most significant bit end, and a group of one bits at the opposite end thereof, i.e. at the least significant bit end. In a stream of code words, it will be apparent that a new code word is indicated by a transition from a 1 to a zero. After such a transition from a 1 to a zero, the number of zero bits first is determined, and then the number of 1's bits is determined. In one decoder embodiment, a counter is used for counting both the number of zero bits and the number of one bits in the code word. At a transition from a zero to a one, the counter contents are stored in a register, and the counter is reset. At a transition from a 1 to a zero bit, indicating the end of the code word, the counter contents, indicating the number of 1 bits in the code word, and the register contents, indicating the number of zero bits in the code word, are used as a memory address of a code converter read only memory (ROM), and the decoder signal is read out from the addressed memory location. In a second embodiment, an AND gate array is used in which the number of zeros in the code word identifies the array row, and the number of ones identifies the array column. The AND gate that is high is indicative of the decoded signal. Means are provided for converting the AND gate array output to binary word form for further signal processing.

BRIEF DESCRIPTION OF THE DRAWINGS

The invention will be better understood from the following description when considered with the accompanying drawings. In the drawings, wherein like reference characters refer to the same parts in the several views:

FIG. 5 is a diagram of a modified form of decoder which includes a gate array.

Figure 1:
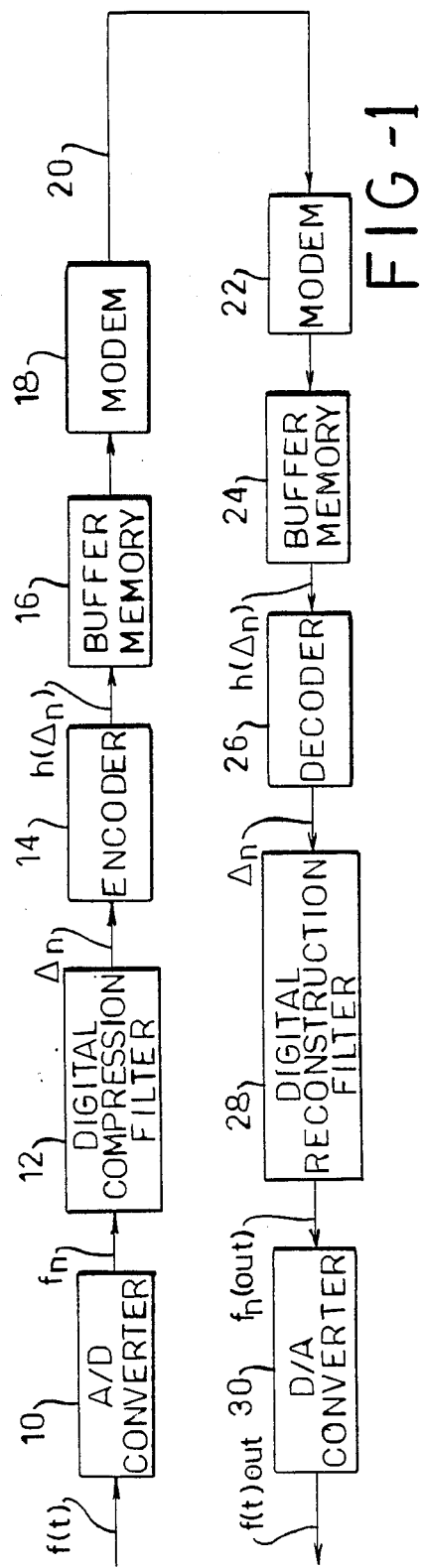
FIG. 1 is a simplified block diagram of a data compression system which includes encoding and decoding means for implementing the novel code of this invention.

Reference first is made to FIG. 1 wherein a data compression system which may employ the novel code of this invention is shown to include an analog to digital converter (A/D converter) 10 for conversion of an analog input signal f(t) into digital form, the $n^{th}$ sample from the analog to digital converter being identified as $f_n$. The digital output from the A/D converter 10 is supplied to a digital compression filter 12 where the output, $f_n$, of the converter is filtered by a transform, T, and the output $\Delta_n$ from the filter has an entropy which is less than the entropy of $f_n$. The compression filter 12 output comprises a stream of equal length words, which words have different probabilities of occurrence.

The $\Delta_n$ output signals from the compression filter 12 are encoded at encoder 14 using a novel code comprising code words which include groups of zeros and ones. An example of such a code is shown in Table 1 hereinbelow wherein least significant bits of the code words comprise one bits, and the most significant bits comprise zero bits. The encoder output, identified as $h(\Delta_n)$, comprises different length words. A reduction in the total number of bits in the encoded signal stream from the encoder 14 over the input signal stream to the encoder is achieved by using the shortest code words to encode the most frequently occurring values of $\Delta_n$.

Figure 2:
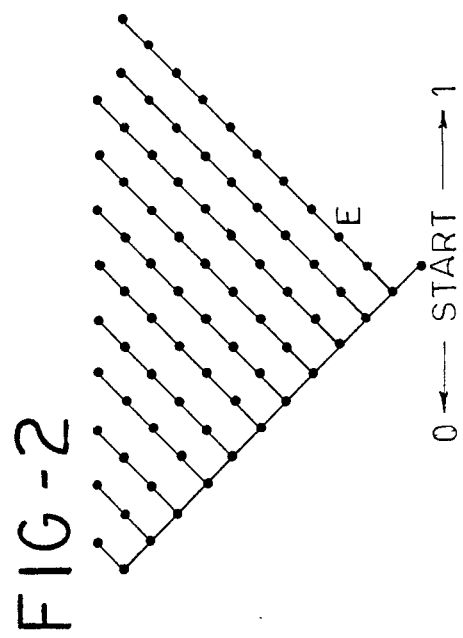
FIG. 2 is a binary decoding tree upon which the decoders shown in FIGS. 4 and 5 are based.
Figure 4:
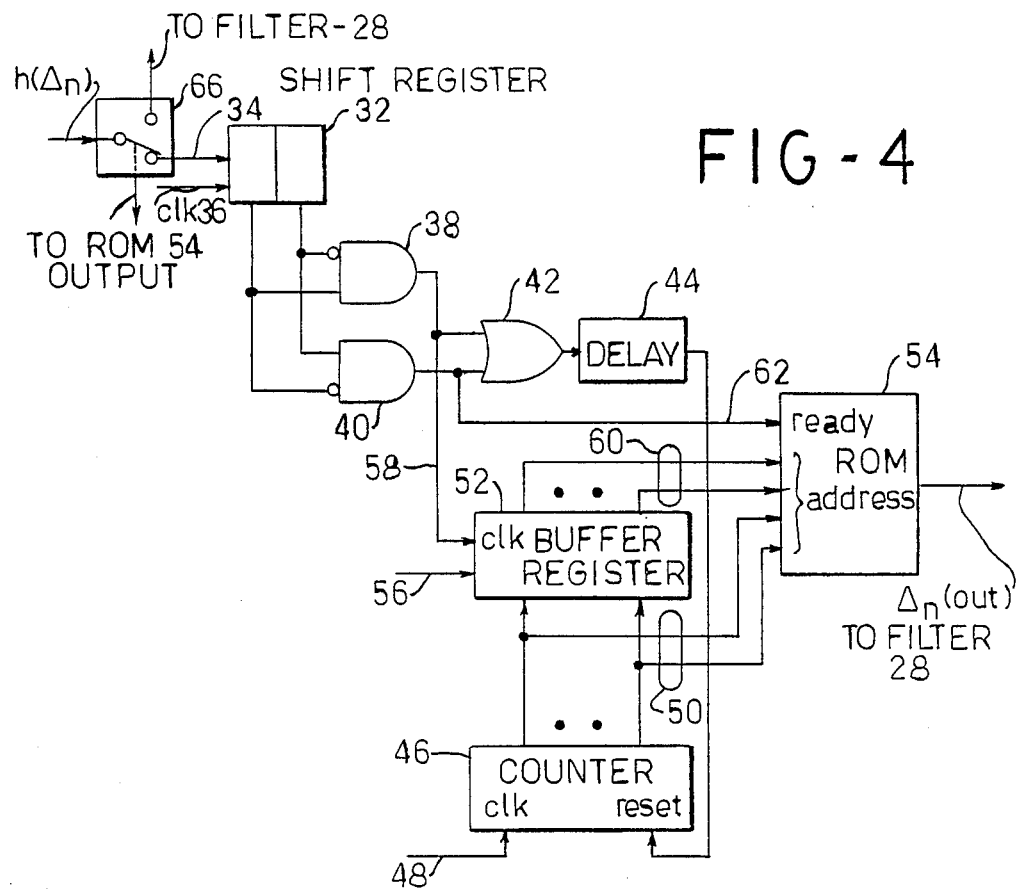
FIG. 4 is a block diagram showing a novel decoder which includes the use of a counter.

The encoded signal stream from encoder 14 is shown supplied to a modem 18 through a buffer memory 16 for transmission over line 20 to a modem 22 at a receiving location. The received signals are demodulated at modem 22 and the demodulated signals are temporarily stored in a receiver buffer memory 24, from which they are supplied to a decoder 26. An encoder for encoding compressed signals is shown in FIG. 2, and decoders for decoding the encoded signals are shown in FIGS. 4 and 5 and described in detail hereinbelow.

TABLE 1

| $\Delta_n$ | CODE WORD | $\Delta_n$ | CODE WORD |
|---|---|---|---|
| 0 | 01 | −17 | 000111111 |
| −1 | 001 | 17 | 001111111 |
| 1 | 011 | −18 | 011111111 |
| −2 | 0001 | 18 | 0000000001 |
| 2 | 0011 | −19 | 0000000011 |
| −3 | 0111 | 19 | 0000000111 |
| 3 | 00001 | −20 | 0000001111 |
| −4 | 00011 | 20 | 0000011111 |
| 4 | 00111 | −21 | 0000111111 |
| −5 | 01111 | 21 | 0001111111 |
| 5 | 000001 | −22 | 0011111111 |
| −6 | 000011 | 22 | 0111111111 |
| 6 | 000111 | −23 | 00000000001 |
| −7 | 001111 | 23 | 00000000011 |
| 7 | 011111 | −24 | 00000000111 |
| −8 | 0000001 | 24 | 00000001111 |
| 8 | 0000011 | −25 | 00000011111 |
| −9 | 0000111 | 25 | 00000111111 |
| 9 | 0001111 | −26 | 00001111111 |
| −10 | 0011111 | 26 | 00011111111 |
| 10 | 0111111 | −27 | 00111111111 |
| −11 | 00000001 | 27 | 01111111111 |
| 11 | 00000011 | −28 | 000000000001 |
| −12 | 00000111 | 28 | 000000000011 |
| 12 | 00001111 | −29 | 000000000111 |
| −13 | 00011111 | 29 | 000000001111 |
| 13 | 00111111 | −30 | 000000011111 |
| −14 | 01111111 | 30 | 000000111111 |
| 14 | 000000001 | −31 | 000001111111 |
| −15 | 000000011 | 31 | 000011111111 |
| 15 | 000000111 | OOR | 000111111111 |
| −16 | 000001111 | | |
| 16 | 000011111 | | |

The compressed signals $\Delta_n$ from the decoder 26 are supplied to a digital decompression, or reconstruction, filter 28 for conversion of the compressed signals to equal length sample signals $f_n(\text{out})$. The reconstruction filter 28 is an exact, or substantially exact, inverse of the compression filter 12 for exact, or nearly exact, reconstruction of the input sample signals $f_n$ supplied to the digital compression filter 12. The compression and reconstruction filters 12 and 28, respectively, are digital and linear, and are realized with difference equations. For example, the difference equation for the transform, T, of the compression filter 12 might be $$\Delta_n = f_n - 2f_{n-1} + f_{n-2}. \quad (1)$$

Its inverse $T^{-1}$, then, would be $$f_n = \Delta_n + 2f_{n-1} - f_{n-2}. \quad (2)$$

A digital to analog converter (D/A converter) 30 converts the sample signals $f_n(\text{out})$ from the digital reconstruction filter 28 to analog form.

In prior art arrangements of the general type shown in FIG. 1, a truncated Huffman code often is employed. An advantage in using a Huffman code includes the fact that Huffman decoders for decoding the Huffman encoded signal will automatically resynchronize after bit errors. The average number of code words that will pass through a Huffman decoder before resynchronization depends upon the number of code words of each of the lengths that appear in the code table, and on the distribution of the code words in the bit stream. Following a bit error, when the signal is Gaussian with standard deviations, $\sigma$'s, of 2 to 32, the average number of samples required to ensure a 99% probability of resynchronization may range, for example, from 14 to 44. With very low error rates, operation is not substantially impaired. However, in systems wherein bit errors may often occur as, for example, in cable television systems, relatively frequent lack of synchronization of the decoder may result in underflow of the receiver buffer memory. This results from the fact that a Huffman decoder removes bits from the receiver buffer memory at a higher bit rate during periods that the decoder is unsynchronized than when the decoder is synchronized.

By using the novel code of this invention, an example of which is shown in Table 1, the decoder can be resynchronized at the next true code word following a bit error thereby eliminating underflow of the receiver buffer memory 24 due to desynchronization. As seen in Table 1, code words are provided for compression filter outputs, $\Delta_n$, in the range of −31 to +31, which are the most frequently occurring values. All other compressed signals, $\Delta_n$, outside the range of ±31 are identified as OOR (Out Of Range) in the table, and these are assigned a code word which comprises a label for the actual compressed signal $\Delta_n$. The actual compressed signal value, together with the label, then is transmitted. With the illustrated code, the OOR code word 000111111111 is supplied as a label to the actual compressed signal value. During decoding, when the label is encountered, the associated $\Delta_n$ value is supplied as the decoder output.

A decoder tree representation for the code is shown in FIG. 2 to which figure reference now is made. There, a rooted, binary, tree is shown comprising a root, or start, node at level 1 of the tree. Zero bits entered into the tree traverse a left branch and 1 bits traverse a right branch. If, for example, the code word 011 is to be decoded, the left branch is followed in response to the first 0 bit. It will be noted that no right branch is provided at the start node since all code words start with at least one 0. From this node, the right branch is traversed to the node labeled E in response to next two 1 bits. From Table 1, it will be seen that node E corresponds to $\Delta_n = +1$. With the illustrated code, it will be seen that all branch (or interior) and leaf (or end) nodes, except the nodes on the left that are reached by the series of 0s at the beginning of the code word, correspond to a decoded $\Delta_n$. The corresponding node is the position on the tree at the transition from 1 to 0, which transition identifies the end of a code word.

Figure 3:
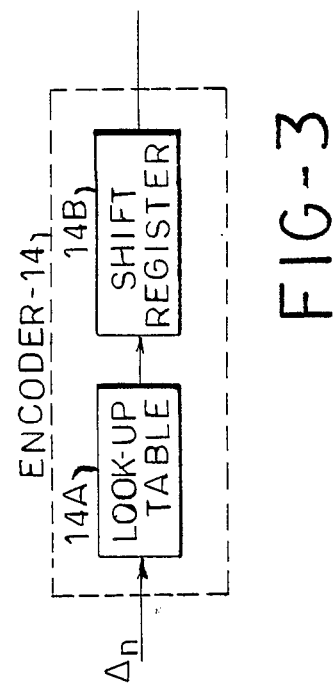
FIG. 3 is a block diagram of an encoder for encoding the compressed signal stream.

The code is readily implemented as, for example, by use of the encoder shown in FIG. 3. The illustrated encoder includes a look-up table 14A comprising a read only memory (ROM) which is addressed by the compressed signal output from digital compression filter 12. Data output from the look-up table is supplied to a shift register 14B. The code words are contained in the look-up table, and bit places at the ends of the variable length code words are loaded with zeros. The look-up table has a word length that is at least one bit greater than the largest code word. For the code set illustrated in Table 1, wherein the maximum word length is 12 bits, a look-up table and shift register which have a word length of at least 13 bits are employed.

The addressed code word, which includes one or more zero bits following the last 1 bit of the code word, is moved into shift register 14B. The shift register contents then are shifted serially from the register until a 1 to zero transition occurs at the end bit position of the shift register from which the word is being shifted. This transition signifies the end of the code word whereupon shifting from the register is stopped. The variable length code words are shifted from register 14B into buffer memory 16 shown in FIG. 1. Buffer memory compensates for the different rates at which code words are obtained from the encoder and are transmitted by modem 18. Obviously, other means for implementing the code will be apparent to those skilled in the art.

Reference now is made to FIG. 4 of the drawings wherein a decoder for decoding a code of the type disclosed in Table 1 is shown. The decoder comprises a two-bit shift register 32 having a serial input 34 into which the encoded, compressed, serial bit stream from the buffer memory 24 is shifted through switch 66 under control of a bit clock signal at line 36 thereof.

The parallel outputs from the first and second stages of shift register 32 are connected to AND gates 38 and 40; the first stage output being connected to the inverting input of AND gate 40 and non-inverting input of AND gate 38, and the second stage output being connected to the inverting input of AND gate 38 and the non-inverting input of AND gate 40. It will be apparent, then, that the output from AND gate 38 is high when the first stage of register 32 contains a 1 and the second stage contains a zero. Conversely, the output from AND gate 40 is high when the first stage of register 32 contains a 0 and the second stage contains a 1. With the illustrated code set a transition from 0 to 1 marks the end of the number of 0s in the code word, and a transition from 1 to 0 marks the end of the code word.

The outputs from AND gates 38 and 40 are supplied to an OR gate 42, and the OR gate output is connected through a delay unit 44 to the reset terminal of a counter 46. The clock input 48 to the counter is supplied with the same bit clock used to shift the data stream into shift register 32. It will be understood, then, that the counter 46 is reset, after a short delay, at every transition from a 0 to a 1 and from a 1 to a 0 in the encoded signal stream.

The parallel outputs 50, from the counter 46 are connected to the parallel inputs of buffer memory means 52, such as a buffer register, and to memory address inputs of a memory unit 54, such as a read only memory (ROM). The output from AND gate 38 (which identifies a transition from a 0 to a 1 bit in the data input stream) is connected to the clock input 58 of the buffer register 52. When the AND gate 38 output goes high, the state of the counter 46 is entered into the buffer register for storage thereof.

The parallel outputs 60 from the buffer register are connected to other address inputs of the ROM 54. The output from the AND gate 40 (which identifies the end of a code word) is connected to the memory address ready, or read, input 62 of memory 54. The counter 46 and buffer memory 52 may comprise four-bit devices, in which case eight memory address signals are supplied to memory 54 over eight parallel outputs 50 and 60. It here will be noted that with an eight bit address, 256 bytes of memory may be addressed. However, with the illustrated code, only 64 bytes would be occupied. When the memory address ready input is enabled, the decoded difference signal, $\Delta_n$ is available at the data output from the memory, which signal is supplied to the digital reconstruction filter 28 shown in FIG. 1.

Although the operation of the decoder is believed to be apparent, a brief description thereof now will be provided. Assume that the encoded bit stream 01 001 0011 is supplied to the two-bit shift register 32 and that initially the register contains two 1s. When the first bit, a 0, is entered into register 32, the AND gate 40 output goes high whereupon memory address ready line 62 goes high and the decoded difference signal, $\Delta_n$, is read from memory. After a short delay the counter 46 is reset through AND gate 40, OR gate 42 and delay 44. When the second bit, a 1, is entered into register 32, the register contains a 1 and 0 whereupon the output of AND gate 38 goes high. Counter 46 is clocked as bits are entered into register 32 whereby counter 46 contains a $1_{10}$. When the output from AND gate 38 goes high, the contents of counter 46 is loaded into buffer register 52 by application of the gate 38 output to the clock input of the buffer register. After a short delay, counter 46 is reset through AND gat 38, OR gate 42 and delay 44.

When register 32 and counter 46 are next clocked a 0 bit (the first bit of the next code word 001) is entered into the first stage of shift register 32, and the AND gate 40 output goes high signifying the end of a word. The AND gate output at the memory address ready line 62 enables the memory 54 whereby the decoded $\Delta_n$ is read out from the addressed memory location. In this case, both the counter 46 and buffer register 52 contain a count of $1_{10}$ which, from the code table of Table 1, would be converted to a memory output of $0_{10}$. After a short delay the counter 46 is reset.

When register 32 and counter 46 are next clocked another 0 bit (the second bit of code word 001) is entered into the first stage of shift register 32, and the counter 46 is advanced to $1_{10}$. The output from neither AND gate 38 or 40 goes high since both stages of shift register 32 contain a 0 bit. Next, when the 1 bit of the second code word 001 is entered into the shift register 32 and the counter 46 is clocked, the shift register 32 contains a 1 bit and a 0 bit, and the counter is advanced to $2_{10}$. The counter output ($2_{10}$) is entered into the buffer register 52 by application of a clock input to the buffer register from AND gate 38. After a delay, counter 46 is reset.

When shift register 32 and counter 46 are next clocked, the counter is advanced to 1, a 0 bit (the first bit of the next code word 0011) is entered into shift register 32, and the AND gate 40 output goes high signifying the end of a code word. The memory address ready line 62 is energized whereby the memory is addressed by the combined outputs from counter 46 and buffer register 52, and the decoded $\Delta_n$ is read out from the addressed memory location. In this case, the buffer register 52 contains $2_{10}$ and the counter 46 contains $1_{10}$, indicating that the code word includes two zero bits and one 1 bit. The code table shows that this is the code word for $-1_{10}$, which would be read out from ROM 54.

As noted above, during the encoding process, difference signals $\Delta_n$, outside the range of $\pm 31$ are labelled by the code word 000111111111. When this label is encountered during the decoding process the actual difference signal $\Delta_n$ follows the same. The OOR output from the ROM 54 is used to switch the actual difference signal, $\Delta_n$, directly to the digital reconstruction filter 28 through operation of switch 66 at the input to the two bit shift register 32. After the difference signal is moved into the digital reconstruction filter 28, the switch 66 is returned to the illustrated switch position in preparation for further decoding.

A modified form of decoder embodying the present invention is shown in FIG. 5, to which figure reference now is made. There a decoder is shown to comprise a matrix array 70 comprising a plurality of AND gates functionally arranged in rows and columns, only a portion of which array is shown. Rows of AND gates 90A through 90D, 91A through 91D, 92A through 92D and 93A through 93D are illustrated, each of which AND gates includes first and second inputs and an output. The first inputs of AND gates in each row are connected together at row input lines 90-1, 90-2, 90-3 and 90-4, respectively, and the second inputs of AND gates in each column are connected together at column input lines 96A, 96B, 96C and 96D, respectively.

The decoder includes row and column shift registers 100 and 102, respectively, each of which includes a number of stages equal at least to the number of row and column input lines to the array. Parallel outputs of the shift registers 100 and 102 are connected to the row and column input lines, respectively, of the array. A logic unit 104, to which the encoded bit stream $h(\Delta_n)$ is supplied through switch 106, has outputs which are supplied to the serial inputs of the row and column shift registers 100 and 102 over lines 108 and 110, respectively, and clock outputs which are supplied to the clock inputs of the row and shift registers 100 and 102 over lines 112 and 114, respectively.

At the beginning of a code word, which is always a zero, a 1 is placed in the first stage of the row shift register 100 by the logic unit 104 over serial input line 108. As each additional zero in the bit stream arrives at the logic unit input, the 1 bit is shifted to the next higher bit position by application of clock signals thereto over line 112. Shifting of the one bit through the register 100 continues until there is a transition in the bit stream from a 0 to a 1, which transition is detected by logic unit 104. Then a 1 bit is entered into the first stage of the column shift register 102 from logic unit 104 over line 110. As each additional 1 in the encoded bit stream arrives at the logic unit input, the 1 bit in column shift register 102 is shifted right one position by application of clock signals thereto over line 114. Shifting of the one bit through the column shift register 102 continues until there is a transition from a 1 to a 0 in the encoded bit stream, at which time an end of word signal is produced at the output 116 of the logic unit. The output from one gate in array 70 is HIGH in response to the parallel outputs from registers 100 and 102.

The next stage in the decoding process involves converting the individual outputs from the AND gates 90A etc. included in the AND gate array back into binary form for filtering by digital reconstruction filter 28. One method for converting the AND gate output into binary form includes scanning the AND gate outputs, as by use of multiplexer 118, to determine which gate output is HIGH. This signal input to a computer 120 then may be used to point to the computer memory location that contains the decoded binary number. The decoded signal $\Delta_n$ then is read out of the memory 120A. An address input for the multiplexer 118 is obtained from the computer 120 through control unit 122, to which an end of word signal also is supplied from logic unit 104 over line 116. The illustrated AND gate scanning scheme is practical when the number of AND gates in the array is small. However, it is less practical when the number is large because of the scanning time and hardware requirements when there is a large number of computer inputs.

When an out of range (OOR) signal is detected, the computer output, at line 121, is used to actuate switch 106 at the input to logic unit 104. The actual difference signal, $\Delta_n$, which follows the OOR signal in the bit stream then is switched directly to the input of the digital reconstruction filter 28. After the difference signal is moved into the digital reconstruction filter, the switch 106 is returned to the illustrated switch position in preparation for further decoding. The end of word signal at line 116 is connected through a delay unit 124 to the reset inputs of the row and column shift registers 100 and 102 in preparation for input of the next encoded signal $h(\Delta_n)$ to the encoder.

Obviously, other means for converting the individual outputs from the AND gate array 70 to binary form may be employed including, for example, a logic network, such as an OR gate network of the type shown in the U.S. patent application Ser. No. 623,342 by the present inventor.

In the operation of the decoder shown in FIG. 5, assume that code word 00111 is to be entered into logic unit 104 for decoding. At the first bit of the encoded signal (a 0 bit) the decoded word is read out of memory 120A, the row and column shift registers 100 and 102 are reset, and a 1 bit is entered into the first stage of the row shift register 100 from the logic unit 104. When the second bit, another zero, is entered into logic unit 104, a clock signal is supplied to shift register 100 from logic unit 104 to shift the 1 bit into the second stage of shift register 100 for energization of row input line 90-2 of the AND gate array. Next, the transition from a 0 to a 1 bit in the code word produces an output from logic unit 104 at line 110 for entry of a 1 bit into the first stage of the column shift register 102. For each 1 bit of the code word, the shift register 102 is clocked and the 1 bit is shifted to the right. In this example, wherein the code word includes three 1 bits, the 1 bit in the shift register 102 is shifted to the third stage for energization of column input line 96C of the AND gate array 70. With row and column input lines 90-2 and 96C energized, the output from AND gate 91C is HIGH while the remainder of the AND gate outputs are LOW.

At the transition from a 1 to a 0 in the code word bit stream (at the end of the code word) an end of word signal is produced by logic unit 104, which is sent to control unit 122. The AND gate outputs are scanned by the multiplexer 118, and the HIGH output from AND gate 91C is supplied to the computer 120 through multiplexer 118, at which time the memory location containing the decoded word $+4_{10}$ is addressed, and the decoded word is read out of memory 120A into the digital reconstruction filter 28.

The invention having been described in detail in accordance with requirements of the Patent Statutes, various other changes and modifications will suggest themselves to those skilled in this art. For example, two separate counters may be employed in the FIG. 4 embodiment wherein one counter counts the number of 0 bits in the code word and the other counter counts the number of 1 bits therein. The counter outputs then may be employed as a memory address for converting to $\Delta_n$ signals. In this arrangement, buffer register 52 no longer is required. It is intended that the above and other such changes and modifications shall fall within the spirit and scope of the present invention as defined in the appended claims.

I claim:

1. In a digital decoder for decoding a stream of encoded digital data words which have been encoded using a variable word length code set in which code words comprise a single group of 0 bits and an adjacent single group of 1 bits, the combination comprising:

means responsive to a stream of encoded digital data words for counting the total number of zero bits in the encoded data words to obtain a count of the total number of zero bits in each data word and for temporarily storing the count total, and means for counting the total number of 1 bits in said encoded data words to obtain a count of the total number of 1 bits in each data word, the total number of zero bits counted together with the total number of one bits counted being indicative of the decoded signal.

2. In a digital decoder as defined in claim 1 including means responsive to said temporary storing means and to said means for counting the total number of 1 bits in said encoded data words for regenerating the digital data words.

3. In a digital decoder as defined in claim 2 wherein said regenerating means comprises memory means simultaneously addressable by outputs from both said temporary storing means and said means for counting the total number of 1 bits in said encoded data words, the decoded digital data words being obtained from the addressed memory location.

4. In a digital decoder as defined in claim 3 wherein said means for temporarily storing the count of zero bits comprises buffer memory means.

5. In a digital decoder as defined in claim 4 wherein said buffer memory means comprises a buffer register.

6. In a digital decoder as defined in claim 3 wherein said means for counting the total number of zero bits in the encoded data words and said means for counting the total number of one bits in the encoded data words comprise digital counter means.

7. In digital decoder as defined in claim 6 including means for resetting said digital counter means in response to transitions from a 1 to a 0 bit and from a 0 to a 1 bit in the encoded data stream.

8. In a digital decoder as defined in claim 1 wherein said means for temporarily storing the count of zero bits comprises buffer memory means.

9. In a digital decoder as defined in claim 8 wherein said buffer memory means comprises a buffer register.

10. In a digital decoder as defined in claim 1 wherein said means for counting the total number of zero bits in the encoded data words and said means for counting the total number of one bits in the encoded data words comprise digital counter means.

11. In a digital decoder as defined in claim 10 including means for resetting said digital counter means in response to transitions from a 1 to a 0 bit and from a 0 to a 1 bit in the encoded data stream.

12. In a method of decoding a stream of encoded digital data words which have been encoded using a code comprising different length code words each of which includes a single group of 0 bits followed by a single group of 1 bits, steps comprising, counting the total number of 0 bits in a code word to obtain a count of the total number of 0 bits in the code word, counting the total number of 1 bits in the code word to obtain a count of the total number of 1 bits in the code word, and regenerating the digital data word from the counts of the total number of 0 bits and total number of 1 bits in the code words.

13. In a method as defined in claim 12 wherein said regenerating step comprises simultaneously supplying the counts of 0 bits and 1 bits as a memory address to a memory and reading the decoded digital data word from the addressed memory location.

14. In a digital decoder for decoding a stream of encoded digital data words which have been encoded using a variable word length code set in which code words comprise a single group of 0 bits followed by a single group of 1 bits, the combination comprising a plurality of AND gates logically arranged in a matrix array of columns and rows, each AND gate having first and second inputs and an output, means for connecting the first inputs of AND gates in each row together to provide row input lines, a separate row input line being provided for each 0 bit in the encoded digital data words, means for connecting the second inputs of AND gates in each column together to provide column input lines, a separate column input line being provided for each 1 bit in the encoded digital data words, means for determining the number of 0 bits in the encoded digital data words and energizing the corresponding row input line, and means for determining the number of 1 bits in the encoded digital data words and energizing the corresponding column input line, the output from the AND gate energized by simultaneous inputs from row and column input lines being indicative of the decoded digital data word.

15. In a digital decoder as defined in claim 14 including means responsive to the output from the energized AND gate in the AND gate array for regenerating the digital data words.

16. In a digital decoder as defined in claim 15 wherein said means for regenerating the digital data words comprises multiplexer means for scanning the AND gate outputs, memory means containing decoded data words, and means responsive to the multiplexer output for addressing said memory means, the decoded data words being obtained from the addressed memory location.

17. In a digital decoder as defined in claim 14 wherein said means for determining the number of 0 bits in the encoded digital data words and said means for determining the number of 1 bits in the encoded digital data words comprise row and column shift registers, respectively, into which registers a single 1 bit is shifted for each encoded digital data word, the row and column shift register contents being shifted by an amount equal to the number of 0 bits and 1 bits, respectively, in the encoded digital data words, parallel outputs from the row and column shift registers being connected to the respective row and column input lines of the AND gate array for energization thereof.

18. An encoder for coding digital input signals comprising,
   a source of digital input signals of equal word length to be encoded, and
   means responsive to equal word length digital input signals from said source for coding those input signals which are within a predetermined signal range, said coding means comprising means for implementing a code comprising a plurality of different length code words at least some of which code words are of the same length, each code word comprising a group of 1 bits at one end position of the code words and a group of 0 bits at the other end thereof, the group of 1 bits being located at the same one end position of each of said code words.

19. An encoder as defined in claim 18 wherein some groups of 1 bits include a single 1 bit and same groups of 0 bits include a single 0 bit.

20. A method of encoding equal word length digital signals which includes converting those equal word length digital signals which are within a predetermined signal range to code words of variable length and labeling those equal word length digital signals which are outside said predetermined signal range with a single code word, the improvement comprising,
   implementing the converting and labeling step by use of a variable word length code wherein some code words are of equal length, and each code word includes a group of 1 bits at the same one end position of the code words and a group of 0 bits at the other end position thereof.

21. A digital signal encoding-decoding combination for use in digital recording-reproducing systems, digital transmitter-receiver systems, or the like, comprising,
   a source of digital signals to be encoded,
   means responsive to digital input signals from said source for coding those input signals which are within a predetermined signal range, said coding means comprising means for implementing a code comprising a plurality of different length code words each of which code words includes a group of 0 bits at one end of the code word and an adjacent single group of 1 bits, and
   means responsive to code words produced by said coding means for decoding the same, said decoding means comprising means for counting the number of 0 bits in the code word and the number of 1 bits therein.

* * * * *